United States Patent
Ding et al.

(10) Patent No.: US 10,001,611 B2
(45) Date of Patent: Jun. 19, 2018

(54) OPTICAL TRANSCEIVER BY FOWLP AND DOP MULTICHIP INTEGRATION

(71) Applicant: INPHI CORPORATION, Santa Clara, CA (US)

(72) Inventors: Liang Ding, Singapore (SG); Radhakrishnan L. Nagarajan, Santa Clara, CA (US); Roberto Coccioli, Westlake Village, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days. days.

(21) Appl. No.: 15/061,941

(22) Filed: Mar. 4, 2016

(65) Prior Publication Data
US 2017/0254968 A1   Sep. 7, 2017

(51) Int. Cl.
*G02B 6/42*  (2006.01)
*G02B 6/13*  (2006.01)
(Continued)

(52) U.S. Cl.
CPC ............. *G02B 6/428* (2013.01); *G02B 6/13* (2013.01); *G02B 6/30* (2013.01); *G02B 6/4232* (2013.01); *G02B 6/4283* (2013.01); *G02B 6/4295* (2013.01); *H01L 21/565* (2013.01); *H01L 21/76877* (2013.01); *H01L 24/11* (2013.01); *H01L 24/81* (2013.01); *H01L 25/167* (2013.01); *G02B 2006/12121* (2013.01); *G02B 2006/12142* (2013.01); *H01L 2224/11334* (2013.01); *H01L 2224/12105* (2013.01); *H01L 2224/13014* (2013.01); *H01L 2224/13016* (2013.01); *H01L 2224/16146* (2013.01); *H01L 2224/16227* (2013.01); *H01L 2224/81191* (2013.01);
(Continued)

(58) Field of Classification Search
CPC .. G02B 6/4232; G02B 6/4253; G02B 6/4255; G02B 6/428
See application file for complete search history.

(56) References Cited

U.S. PATENT DOCUMENTS

| | | | | | |
|---|---|---|---|---|---|
| 5,818,404 | A | * | 10/1998 | Lebby | H01L 25/167 257/81 |
| 5,907,477 | A | * | 5/1999 | Tuttle | H01L 23/24 174/260 |
| 6,507,115 | B1 | * | 1/2003 | Hofstee | H01L 23/3677 257/685 |
| 6,623,178 | B1 | * | 9/2003 | Sakurai | G02B 6/4201 385/88 |

(Continued)

*Primary Examiner* — Daniel Petkovsek
(74) *Attorney, Agent, or Firm* — Richard T. Ogawa; Ogawa P.C.

(57) ABSTRACT

An optical transceiver by hybrid multichip integration. The optical transceiver includes a PCB with a plurality of prefabricated surface bonding sites. A first chip includes a FOWLP package of multiple electronics devices embedded in a dielectric molding layer overlying a dielectric redistribution layer is disposed on the PCB by respectively bonding a plurality of conductor balls between the dielectric redistribution layer and the plurality of prefabricated surface bonding sites while exposing soldering material filled in multiple through-mold vias (TMVs) in the dielectric molding layer. The optical transceiver further includes a second chip configured as a Sipho die comprising photonics devices embedded in a SOI wafer substantially free from any electronics device process. The second chip is stacked over the first chip with multiple conductor bumps being bonded respectively to the soldering material in the multiple TMVs.

10 Claims, 5 Drawing Sheets

(51) Int. Cl.
  *G02B 6/30*    (2006.01)
  *H01L 21/56*   (2006.01)
  *H01L 21/768*  (2006.01)
  *H01L 23/00*   (2006.01)
  *H01L 25/16*   (2006.01)
  *G02B 6/12*    (2006.01)

(52) U.S. Cl.
  CPC .............. *H01L 2924/06* (2013.01); *H01L 2924/10253* (2013.01); *H01L 2924/1205* (2013.01); *H01L 2924/12042* (2013.01); *H01L 2924/12043* (2013.01); *H01L 2924/141* (2013.01); *H01L 2924/1426* (2013.01); *H01L 2924/1433* (2013.01)

(56) References Cited

U.S. PATENT DOCUMENTS

| | | | |
|---|---|---|---|
| 7,005,719 B2* | 2/2006 | Masumoto | G02B 6/43 257/432 |
| 8,822,281 B2* | 9/2014 | Pagaila | H01L 21/568 257/686 |
| 8,861,217 B2* | 10/2014 | Lin | H05K 1/141 174/260 |
| 9,036,952 B2* | 5/2015 | La Porta | H05K 13/00 385/2 |
| 9,595,509 B1* | 3/2017 | Yap | H01L 25/105 |
| 2014/0035935 A1* | 2/2014 | Shenoy | H01L 23/15 345/501 |
| 2015/0295098 A1* | 10/2015 | Toda | H01L 31/02005 385/14 |

\* cited by examiner

OPTICAL TRANSCEIVER BY FOWLP AND DOP MULTICHIP INTEGRATION

CROSS-REFERENCE TO RELATED APPLICATIONS

N/A

BACKGROUND OF THE INVENTION

The present disclosure is related to an opto-electrical integration, more particularly, to a compact optical transceiver based on Die-on-Package multichip stacking integration utilizing low cost Fan-Out Wafer Level Packaging (FOWLP) architecture and through-mold via (TMV) technology.

As science and technology are updated rapidly, processing speed and capacity of the computer increase correspondingly. The communication transmission or reception using the traditional cable is limited to bandwidth and transmission speed of the traditional cable and mass information transmission required in modern life causes the traditional communication transmission overload. To correspond to such requirement, the optical fiber transmission system replaces the traditional communication transmission system gradually. The optical fiber communication is chosen for systems requiring higher bandwidth and longer distance that electrical cable cannot accommodate. Present electronic industrial performs research toward optical transmission which will become the mainstream in the future even for short distance communication. Said optical communication is a technology in that light wave functions as signal carrier and transmitted between two nodes via the optical fiber. An optical communication system includes an optical transmitter and an optical receiver. By the optical transceiver, the received optical signal can be converted to an electrical signal capable of being processed by an IC, or the processed electrical signal can be converted to the optical signal to be transmitted via optical fiber. Therefore, objective of communication can be achieved.

With the advances of optical communication technology and applications driven by the market, the demands become stronger on increasing bandwidth for optical communication and decreasing package footprint of an optical transceiver. It is more and more challenging to integrate all necessary components within smaller and smaller module package. For the state-of-art optical transceiver products, all the critical components including clock data recovery (CDRs), modulator drivers, transimpedance amplifiers (TIAs), and photonics chips having optical passives, modulators, and photo detectors, are assembled side-by-side on a PCB in a 2D fashion. This approach has at least two drawbacks for developing any future optical transceiver with data rate greater than 400G. Firstly, the side-by-side placement of the components consumes much of the board area for optical transceiver as a pluggable product or major substrate area for on-board optics product, making it very difficult to further shrink the product size. Secondly, side-by-side placement on the PCB creates longer electrical transmission length and often requires wire bonds between electrical die and photonics die, introducing more electrical loss which damages signal integrity for very high data rate transceiver product, e.g., >56 Gbaud symbol rate. In particular, the wire bonds lead to impedance mismatch due to large inductance, degrading the signal a lot at higher frequencies. As such, it is not practical to use wirebond as electrical interconnect between chips or between chips and board for the applications where high frequency (e.g., >40 GHz) analog signal is transmitted. The large inductance of wire bonds has become a bottle neck of high speed signal transmission.

To shorten the interconnect length of conventional wire bonds between electronics devices (e.g., from LD driver/TIA to digital signal processor DSP) or between electronics (driver/TIA) and photonics (e.g., CDR and PAM4 ASIC), people have started to use through-silicon via (TSV) process in Si photonics die to replace wire bonds and make interconnections. However, TSV process is still ready for mass production due to high cost of performing the process and handling thin wafer. Moreover, the current infrastructure and investment only allow for fine TSV process in 12-inch wafers. This limits the flexibility of TSV-based interconnects to be employed in various technologies that use substrate size less than 12-inch, e.g., 8-inch SiGe process, 8-inch BiCMOS process, GaAs-substrate process, InP-substrate process, and 8-inch MEMS process. The complexity of manufacturing process, low yield, inefficient wafer area usage, and very expensive in scaling to advanced electronics making the TSV process impractical for making Si photonics field product. Therefore, there is demand on alternative solutions for integrating electronics functions and photonics circuits to meet the requirement of ever increasing bandwidth between electronics and photonics. It is desired to have an improved packaging scheme that enjoys the high performance benefit of a 3D multichip stacking integration with much shorter interconnect and lower parasitic while keeping the packaging process simple and cost low.

BRIEF SUMMARY OF THE INVENTION

The present disclosure is related to an integrated photonics device. More particularly, a high-speed compact optical transceiver is formed by a die-on-package (DoP) multichip integration of a high-yield silicon photonics chip stacking over a FOWLP packaged electronics chip with through-mold vias (TMVs) for electrical coupling. In certain embodiments, the invention is applied for high speed optical communication, though other applications are possible.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

Serial link performance is limited by the channel electrical bandwidth and the electronic components. In order to resolve the inter-symbol interference (ISI) problems caused by bandwidth limitations, we need to bring all electrical components as close as possible to reduce the distance or channel length among them. Monolithic integration of photonics and electronics (e.g., see U.S. Pat. No. 8,895,413) promises a one-time boost in their capabilities. The patent by Luxtera discloses two monolithic ways to integrate Si photonics and high speed electronics, i.e., side-by-side integration and 3D integration using through-Si-via (TSV) embedded in electronics part. Indeed, these two methods introduces much lower parasitic between electronics and photonics than what wire bond method provides. However, the process is very expensive and production yield is low due to the extreme complexity of the manufacturing process. In system point of view, there is another drawback, i.e., wirebonding is still needed between electronic circuits and PCB or package substrate. Therefore, there is no improvement in electrical signal transmission from PCB or package substrate to electronics circuits or vice versa. An alternative way to achieve advanced integration with high yield is to use multiple chip integration technology. In this application, we will disclose a high speed compact optical transceiver using electrical/optical die-stacking integration via separately fabricated TSV/TGV interposers as well as a staggered bump arrangement with optimized pitch size.

In a specific embodiment, the present invention provides an optical transceiver by hybrid multichip integration. The optical transceiver includes a PCB with a plurality of prefabricated surface bonding sites. Additionally, the optical transceiver includes a first chip comprising multiple electronics devices embedded in a dielectric molding layer overlying a dielectric redistribution layer. The first chip is disposed on the PCB by bonding the dielectric redistribution layer via a plurality of conductor balls respectively on the plurality of prefabricated surface bonding sites while exposing soldering material filled in multiple through-mold vias (TMVs) formed in the dielectric molding layer. Moreover, the optical transceiver includes a second chip comprising photonics devices embedded in a SOI wafer having a front surface with multiple conductor bumps being added. The second chip is stacked over the first chip with the multiple conductor bumps on the front surface being bonded respectively to the soldering material in the multiple TMVs.

In an alternative embodiment, the present invention provides a method for assembling a compact optical transceiver. The method includes providing a PCB with a plurality of prefabricated surface bonding sites and packaging a first chip by embedding multiple electronics devices in a dielectric molding layer overlying a dielectric redistribution layer. Additionally, the method includes adding a plurality of conductor balls to a back-end surface of the dielectric redistribution layer. Further, the method includes forming multiple through-mold vias (TMVs) in the dielectric molding layer. Each TMV is filled with a soldering material. Furthermore, the method includes disposing the first chip on the PCB by bonding the plurality of conductor balls respectively onto the plurality of prefabricated surface bonding sites while exposing the soldering material filled in the multiple TMVs. The method further includes forming a second chip comprising photonics devices embedded beneath a front surface of a SOI wafer without any through-silicon via structure and adding multiple conductor bumps on the front surface. Moreover, the method includes flipping the second chip to bond the multiple conductor bumps respectively to the soldering material in the multiple TMVs in the dielectric molding layer of the first chip.

Many benefits are provided with the improvement according to the present invention. In certain embodiments, the present invention provides a 3D die-on-package (DoP) multichip stacking integration for packaging an optical transceiver achieving superior compact size with substantially low parasitic capacitance using lower cost FOWLP and TMV technology. The stacked architecture saves more board area, which will be for smaller form factor optical module or for on-board optics application. By fully decoupling processes for photonics and electronics devices on separate chips, much higher yield can be achieved for each component and higher reliability for the optical transceiver as a whole. Additionally, by utilizing the TMV technology and direct conductor ball bonding via redistribution layer and PCB, all unreliable high-parasitic wire bonds including LD power wires and high-cost low-yield TSV bonding in Si-photonics chip are eliminated to provide a super-low parasitic assembly process. Using TMV technology to make vertical interconnect between top and bottom dies or packages is flexible to various electronic technology nodes. This is beneficial if the optical transceiver designer want to change the technology of driver/TIA (SiGe, GaAs, or CMOS) and CDR or PAM4 ASIC (45 nm, 28 nm, 20 nm CMOS). Combining FOWLP and TMV process, people do not need to re-design the individual chip and re-develop its corresponding processes of each chip. The present invention achieves these benefits and others in the context of broadband communication technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present disclosure is related to an integrated photonics device. More particularly, a high-speed compact optical transceiver is formed by a die-on-package (DoP) multichip integration of a high-yield silicon photonics chip stacking over a FOWLP packaged electronics chip with through-mold vias (TMVs) for electrical coupling. In certain embodiments, the invention is applied for high speed optical communication, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 1:
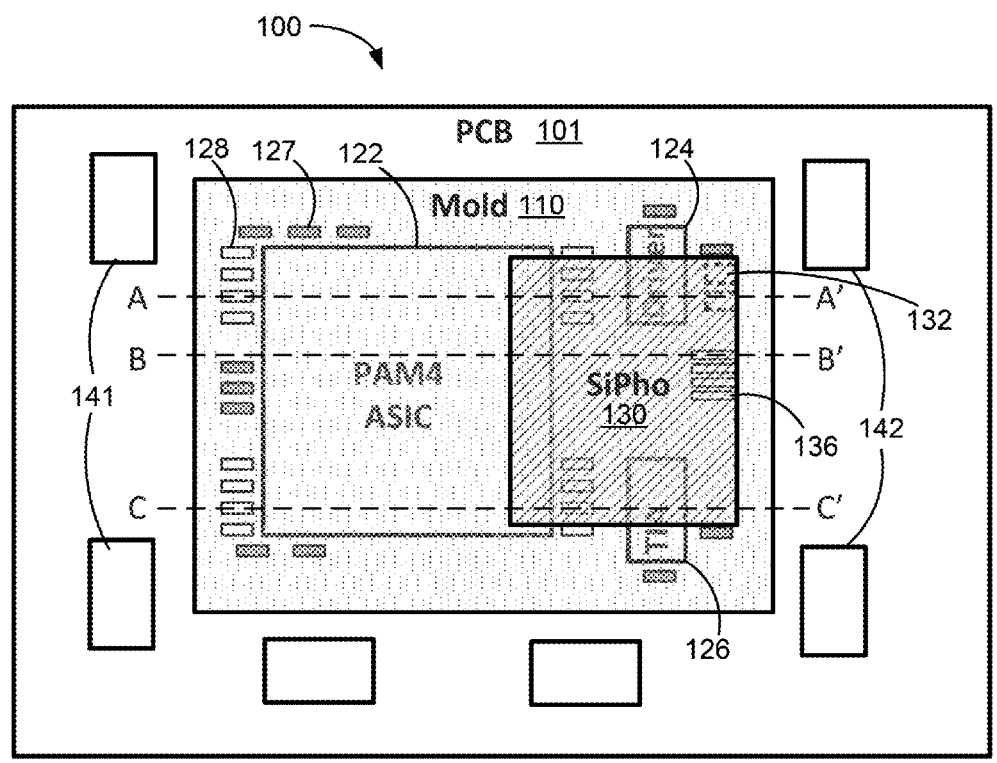
FIG. 1 is a top view of an optical transceiver assembled by DoP process on a PCB according to an embodiment of the present invention.

FIG. 1 is a top view of an optical transceiver assembled by multichip integration including FOWLP and DoP process on a PCB according to an embodiment of the present invention. This diagram is merely an example, which should not unduly limit the scope of the claims. One of ordinary skill in the art would recognize many variations, alternatives, and modifications. As shown, an optical transceiver 100 is assembled by multichip integration. A first chip is formed under a Fan-Out Wafer Level Packaging (FOWLP) architecture to integrate all critical electronics dies needed for an optical transceiver. A second chip is formed as a single Si-photonics (Sipho) die to integrate major photonics parts including surface-mounted laser diode. The second chip or Si-photonics die is stacked over the first chip in a Die-on-Package process to couple the corresponding electronics devices in the first chip by employing through-mold via (TMV) technology.

Referring to FIG. 1, in the top view of the assembled optical transceiver 100, a molding material 110 covers multiple electronics devices in a package disposed on the PCB 101. The multiple electronics devices are either separate electronics dies including PAM4 ASIC module 122, Driver module 124, Trans-impedance Amplifier module 126, or multiple individual AC coupling capacitors 128 and other passive components 127. On an exposed front-end surface of the molding material 110, a Sipho die 130 is disposed by flipping its front surface to face the exposed front-end surface of the molding material 110. As seen, one or more laser diodes 132 are mounted on front surface of the Sipho die that faces down in this top view. Other components of the optical transceiver 100 including at least a microcontroller unit (MCU) 141 and a power management unit (PMU) 142 are directly assembled on the PCB 101. Additional features of the assembly structure of the compact optical transceiver 100 can be found below in several cross sectional cut views along lines AA', BB', and CC'.

Figure 2:
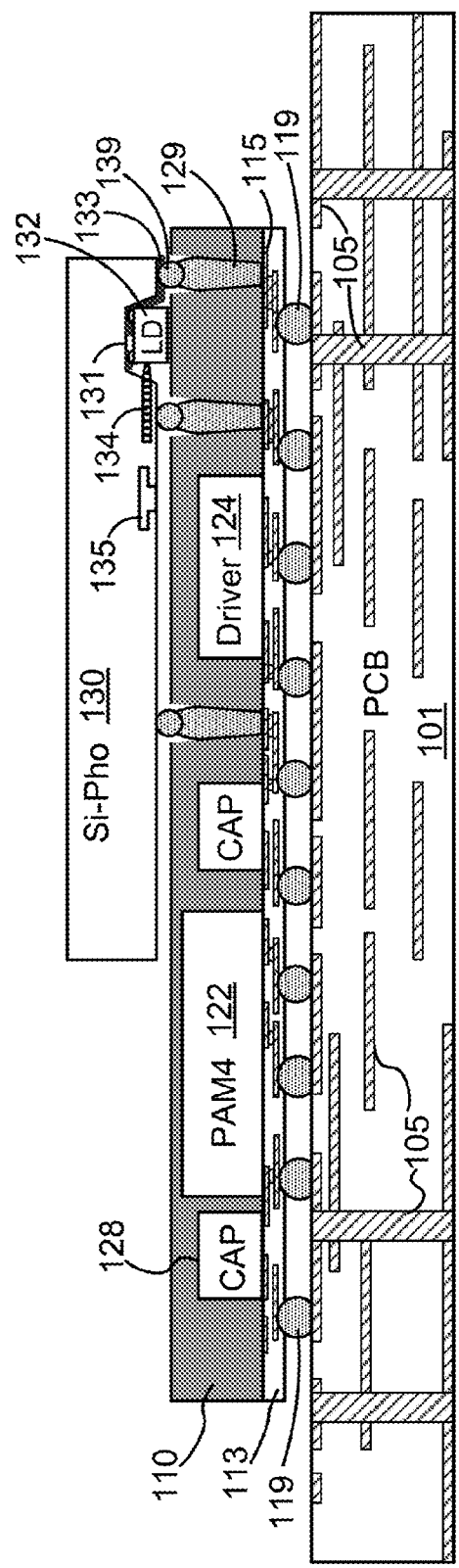
FIG. 2 is a diagram showing cross-sectional AA' cut view of the optical transceiver assembly of FIG. 1 according to the embodiment of the present invention.

FIG. 2 is a diagram showing cross-sectional AA' cut view of the optical transceiver assembly of FIG. 1 according to the embodiment of the present invention. This diagram is merely an example, which should not unduly limit the scope of the claims. One of ordinary skill in the art would recognize many variations, alternatives, and modifications. As shown in this AA' cut view, a first chip is bonded to a surface of the PCB 101 by a plurality of balls 119. The first chip, as mentioned earlier in FIG. 1, is a FOWLP package of multiple electronics dies. Particularly in this cut view, a PAM4 ASIC module 122, a Driver module 124, and several AC coupling capacitors (CAP) 128 are embedded in a molding material 110. The molding material 110 is an Embedding Insulation Sheet (EBIS) type dielectric material commonly used for the FOWLP package process.

As seen, the molding material 110 is formed overlying another dielectric material served as a redistribution layer (RDL) 113. This RDL 113 includes multiple patterned or separately embedded conductive pads or wirings 115. On a back-end surface of RDL 113, a plurality of conductor balls 119 are added via a back-end process before disposing the FOWLP package onto corresponding a plurality of prefabricated surface bonding sites of the PCB 101. Each of the plurality of conductor balls 119 forms an electrical contact to a conductive pad inside the RDL 113 and is led to other locations of the 2D plane of the RDL 113 for connecting to designated electronics devices in the FOWLP package. Of course, the plurality of conductor balls 119 also connect the internal wirings of the PCB that lead to other electronics devices on the PCB such as MCU or PMU or other external sources for operating the optical transceiver.

Additionally shown in FIG. 2, a second chip 130 is stacked over the first chip. In an embodiment, the second chip 130 is formed as a Sipho die by integrating substantially all photonics devices only without including any electronics device process and any costly trans-silicon via (TSV) structure through the fragile photonics devices. In an example, the photonics devices in the Sipho die 130 include optical modulator 135, multiple photo diodes (137 in FIG. 4), and Si or SiN based optical waveguides for beam couplers/splitters or mux/demux devices (not explicitly shown). In another example, several fiber coupling structures 134 or 136 are formed on the front surface of the second chip for either coupling laser outputs or optical fibers for input/output optical signals of the optical transceiver.

Referring again to FIG. 2, such multichip stacking integration is achieved by utilizing a TMV technology via a Die-on-Package process. Before stacking the second chip, on the exposed front-end surface of the molding material 110 multiple through-mold via (TMV) structures are formed with straight profile through the whole thickness of the molding material 110 in multiple patterned locations to reach corresponding conductive pads in the RDL 113. A soldering material 129 is dropped in to substantially fill the whole via with its tip near or slightly above the front-end surface of the molding material 110. Accordingly, the second chip 130, after a separate packaging process to form a Sipho die, is prepared by adding multiple conductor bumps 139 on its front surface in locations that are designated to match the patterned locations of multiple TMVs. Now, the second chip 130 is flipped over to make the front surface facing down the exposed front-end surface of the molding material so that the multiple conductor bumps 139 are respectively bonded (by soldering) to soldering material in the multiple TMVs.

The bonding between the second chip and the first chip via the TMV structure via conductor bump 139 provides a low-parasitic electrical connection for designated opto-electrical control and signal communication between the electronics devices in the first chip and the photonics devices in the second chip. For example, the modulator 135 embedded in the Sipho die 130 is connected, via one of the multiple conductor bump 139 through a soldering material 129 and one or more conductive pads and wirings in the RDL 113, to the Driver module 124 to modulate output laser light based on designated digital signal patterns. In another example, the photo diodes 137 (see FIG. 4 below) are also electrically coupled, via one of the multiple conductor bump 139 through a soldering material 129 and one or more conductive pads and wirings in the RDL 113, to send converted current signals (from received optical signals) to the Trans-impedance Amplifier module 126. No wirebonds exist in the whole optical transceiver package on PCB assembly. The wirebonds-free assembly scheme makes the optical transceiver capable of delivering >56 Gbaud symbol rate, and thus capable of delivering 112 Gbps with PAM4 signal modulation format.

In another embodiment, one or more laser diodes 132 are mounted on a prefabricated recess region 131 of the front surface where a conductive pad 133 can be disposed for receiving the laser diodes 132. The conductive pad 133 includes an extended portion at a normal (not-recessed) region on the front surface. When adding multiple conductor bumps 139 on the front surface, at least one conductor bump is attached the extended portion of the conductive pad 133 for providing DC power for the laser diodes 132. The recessed region 131 is formed to allow a sufficient gap between the flip-bonding Sipho die on the FOWLP package even with the surface mounting laser diodes being installed there. Again, no wirebonds exist in this DoP process, even the wire bonds typically used for powering laser diodes are replaced by bump bonds and internal wirings to reduce overall parasitic capacitance.

Figure 3:
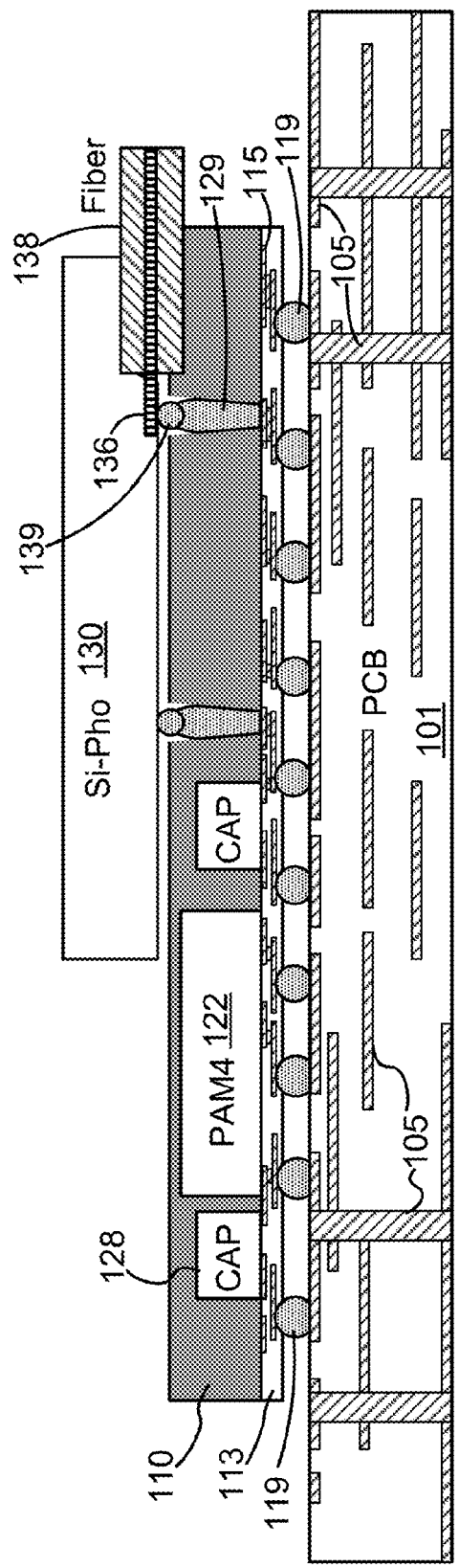
FIG. 3 is a diagram showing cross-sectional BB' cut view of the optical transceiver assembly of FIG. 1 according to the embodiment of the present invention.

FIG. 3 is a diagram showing cross-sectional BB' cut view of the optical transceiver assembly of FIG. 1 according to the embodiment of the present invention. This diagram is merely an example, which should not unduly limit the scope of the claims. One of ordinary skill in the art would recognize many variations, alternatives, and modifications. As shown in the particular cut view along BB' line, an optical fiber 138 is coupled to the corresponding fiber coupling structure 136 formed in the front surface of the second chip 130. In this multichip stacking configuration, at least a section of the optical fiber 138 is capped between the front surface of the second chip and the front-end surface of the molding material 110 of the first chip. In a specific embodiment, the fiber coupling structure 136 is formed to align optical core of the optical fiber 138 with the optical waveguides in the Sipho die 130. The proper alignment may be achieved by proper positioning the fiber coupling structures 136 such as V-groove at a recessed region of the front surface when forming the Sipho die 130.

Figure 4:
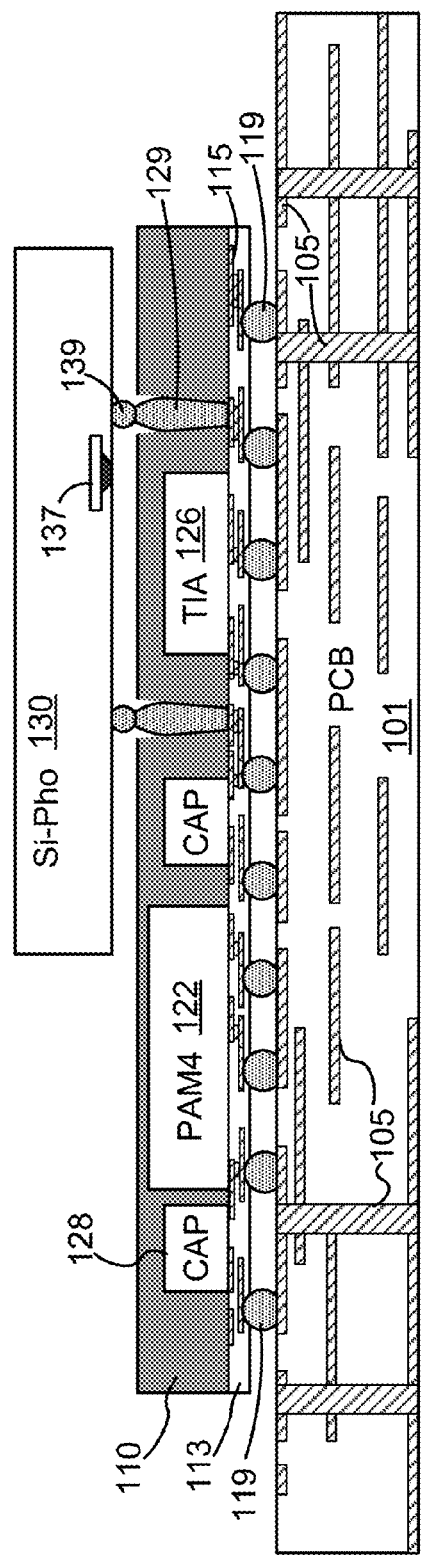
FIG. 4 is a diagram showing cross-sectional CC' cut view of the optical transceiver assembly of FIG. 1 according to the embodiment of the present invention.

FIG. 4 is a diagram showing cross-sectional CC' cut view of the optical transceiver assembly of FIG. 1 according to the embodiment of the present invention. This diagram is merely an example, which should not unduly limit the scope of the claims. One of ordinary skill in the art would recognize many variations, alternatives, and modifications. As shown in the particular cut view along CC' line, a first chip is bonded to the PCB 101 via a plurality of balls 119. The first chip, as mentioned earlier in FIG. 1 and FIG. 2, is a FOWLP package of multiple electronics dies. Particularly in this cut view, a PAM4 ASIC module 122, a Trans-impedance Amplifier (TIA) module 126, and several AC coupling capacitors (CAP) 128 are embedded in a molding material 110. The second chip, as mentioned earlier in FIG. 1, FIG. 2 and FIG. 3, is a Sipho die 130 that integrates substantially all photonics devices including embedded photo diodes 137 and surface mounted laser diodes 132 and optical fibers 138. The bonding between the second chip and the first chip via the TMV structure via conductor bump 139 provides a low-parasitic electrical connection for designated opto-electrical control and signal communication between the electronics devices, such as TIA 126, in the first chip and the photonics devices, such as photo diodes 137, in the second chip.

In an alternative embodiment, the present invention also provides a method for assembling a compact optical transceiver by illustrating a few key processes based on a multichip stacking integration employing low cost FOWLP architecture and TMV technology for facilitating a DoP process. FIGS. 5A-5D are diagrams showing a series of processes of the method according to an embodiment of the present invention. These diagrams are merely examples, which should not unduly limit the scope of the claims. One of ordinary skill in the art would recognize many variations, alternatives, and modifications. One or more processes may be skipped by the illustration of just four snap shots of the whole assembly processes. One of the existing or additionally processes may be inserted in more than single sequential orders. Other processes may be included upon minor changes in components while not affecting the main sequence of the assembly process.

Figure 5A:
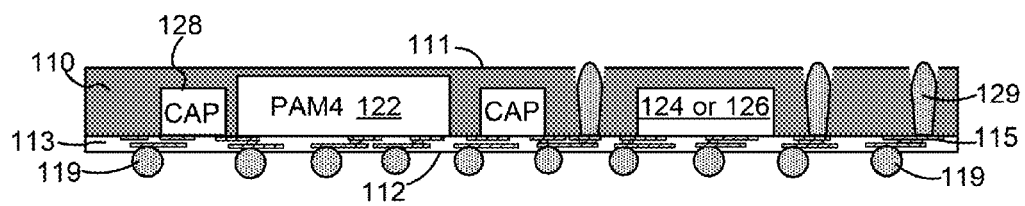
FIGS. 5A-5D are diagrams showing a series of processes for assembling a compact optical transceiver according to an embodiment of the present invention.

Referring to FIG. 5A in a cross-sectional view, a FOWLP package is formed with multiple electronics devices embedded in a dielectric molding layer 110 overlying a dielectric redistribution layer 113. The dielectric molding layer 110 leaves a front-end surface 111 and the dielectric redistribution layer 113 has a back-end surface 112. The FOWLP package basically integrates substantially all electronics dies including PAM4 or CDR, driver, and TIA for assembling an optical transceiver. Being incorporated as part of the FOWLP process, a TMV process is performed to create multiple straight profiled through-mold vias (TMVs) in multiple patterned locations. Additionally, the FOWLP process also includes a formation of patterned conductive pads 115 or wirings in the dielectric redistribution layer 113. These conductive pads 115 are selectively formed, using Cu material through a back-end process, at certain locations in the front end surface (not exposed) and alternative locations in the back-end surface 112. A 2-dimensional network of conductive wirings is also formed therein to selectively connect those conductive pads based on the designated application.

In an embodiment, each TMV is created by laser process to etch or drill down from the front-end surface 111 with high aspect ratio through the whole thickness of the molding layer 110 to reach one of the conductive pad 115 at the front end (generally not exposed) of the dielectric redistribution layer 113. Following the formation of multiple TMVs, a soldering material 129 is dropped into each TMV following a formation of UBM structure on the Cu pad by electroless Ni/Au plating. In certain embodiments, the soldering material is sufficiently filled each TMV such that a tip portion of the soldering material 129 is near or slightly above the front-end surface 112.

In another embodiment, the FOWLP process also includes a back-end surface bump formation process. In particular, on the back-end surface 112, a plurality of conductor balls 119

(usually made of a selected soldering material or alloy) is formed at predetermined locations that are matched with a plurality of prefabricated surface bonding sites on the PCB 101.

Figure 5B:
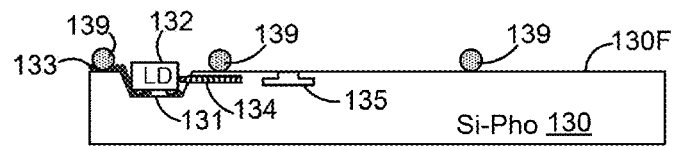

Referring to FIG. 5B in a cross-sectional view, a Si-photonics (Sipho) die 130 is formed separately to integrate photonics devices only. No critical electronics device process is done with this die. Particularly, the Sipho die 130 is made from a piece of SOI wafer in which various optical waveguides and optical components are formed. In an example, the optical waveguides can be Si-based or $Si_3N_4$-based to provide optical beam coupling/splitting or wavelength mux/demux functions. Other components including optoelectronic devices such as laser modulator 135 and photo diodes can be also embedded beneath a front surface 130F of the Sipho die 130. But, no any through-Silicon via structure is included in the Sipho die formation process to avoid easy damage to the embedded photonics devices or near-surface optical components in the thin SOI wafer and any associated low-yield production issue.

In a specific embodiment, the Sipho die formation process also includes forming a recessed region 131 in the front surface 130F and a conductive pad 133 can be laid out and placed over the recessed region 131 including at least one extended portion with regular level of the front surface 130F. This recessed region 131 plus corresponding conductive pad 133 provides a base for mounting one or more laser diodes 132. The laser diodes 132 has all its corresponding electrical connections especially those for receiving a DC current for driving laser excitations being established through the conductive pad 133.

In another specific embodiment, a follow-up process of preparing the Sipho die 130 includes adding multiple conductor bumps 139 on multiple selected locations on the front surface 130F including the at least one extended portion of conductive pad 133. Nevertheless, the multiple conductor bumps, each may be made of a selected soldering material, are configured to form electrical connection for the embedded laser modulator 135 or photo diodes as well as for the surface mounted laser diodes 132.

Figure 5C:
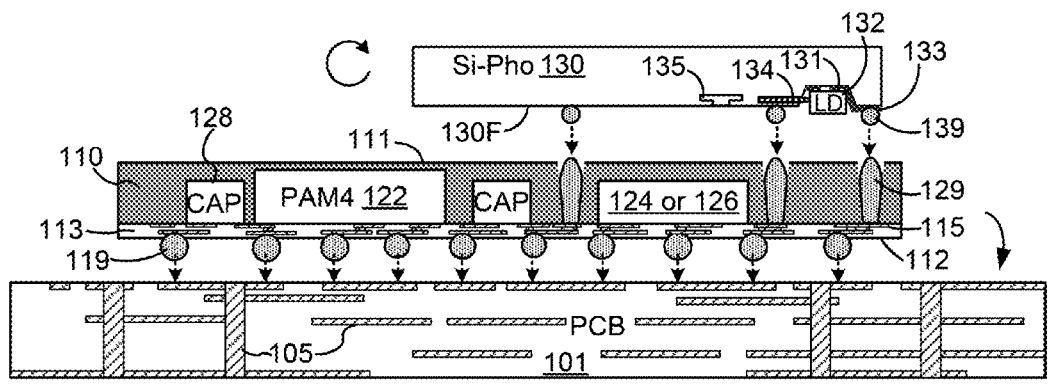

Referring to FIG. 5C, the optical transceiver assembly process is performed by a multichip 3D stacking integration. The FOWLP package is disposed on the PCB 101 with the back-end surface 112 facing the PCB so that the plurality of conductor balls 119 is respectively bonded to the plurality of prefabricated surface bonding sites of the PCB 101. These bump bonds substantially establish necessary electrical connections of the multiple electronics devices in the FOWLP package between themselves or between them and external devices without using any wire bonds. Thus, desired very low parasitic capacitance for the attachment of the FOWLP package on the PCB can be achieved for assembling a high (>56) Gbaud symbol rate transceiver.

Additionally, the Sipho die 130 is flipped over to have the front surface 130F facing the front surface 112 of the molding material 110 of the FOWLP package. A Die-on-Package process is performed by bonding the multiple conductor bumps 139 directly onto respective tip portion of soldering material 129 in the multiple TMVs formed in the molding material 110. Again, the attachment of Sipho die 130 on the FOWLP package requires no wire bonds even for the power line of the one or more laser diodes 132. Instead, TMV technology is employed to make vertical interconnect between top Sipho die and bottom electronics dies in FOWLP package. This provides tremendous flexibility to various electronic technology nodes and is beneficial for the optical transceiver designer to change particular technology for optimizing the performance of modulator driver/TIA modules by selecting either SiGe, GaAs, or CMOS technology and enhancing the performance of CDR or PAM4 ASIC under 45 nm, 28 nm, 20 nm CMOS technology scaling up.

Figure 5D:
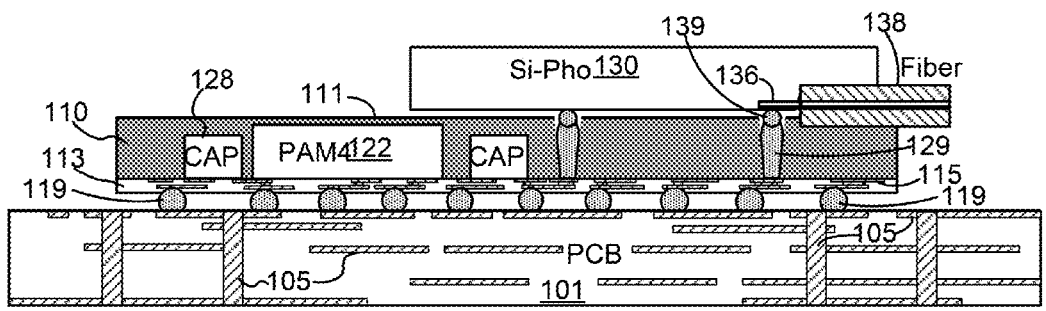

Referring to FIG. 5D in an alternative cross-sectional view of the assembled optical transceiver on the PCB, after the DoP process multichip stacking of the Sipho die 130 on the FOWLP packaged chip, one or more optical fibers 138 are attached to one or more prefabricated fiber coupling structures 136 on an edge of the front surface 130F of Sipho die 130. Now the locations of fiber coupling structures 136 are somewhere between the front surface 130F and the front-end surface 111 of the molding material 110. In an embodiment, the front surface 130F of the Sipho die 130 is properly recessed from the end region to allow space for installing the optical fibers 138 such that the fiber core can be properly aligned (and fixed) to the optical waveguides in the Sipho die 130. Of course, one of ordinary skill in the art shall recognize many variations, alternatives, and modifications about the optical fiber installation on to the compact optical transceiver.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An optical transceiver by hybrid multichip integration comprising:
   a printed circuit board (PCB) with a plurality of prefabricated surface bonding sites;
   a first chip comprising multiple electronics devices embedded in a dielectric molding layer overlying a dielectric redistribution layer, the first chip being disposed on the PCB by bonding the dielectric redistribution layer via a plurality of conductor balls respectively on the plurality of prefabricated surface bonding sites while exposing soldering material filled in multiple through-mold vias (TMVs) formed in the dielectric molding layer and one or more prefabricated recessed structures;
   a second chip comprising photonics devices embedded in a SOI wafer having a front surface with multiple conductor bumps and one or more fiber coupling structures, the second chip being stacked over the first chip with the multiple conductor bumps on the front surface being bonded respectively to the soldering material in the multiple TMVs; and
   one or more optical fibers fixed within V-grooves defined between recessed regions in the front surface of the second chip and the one or more prefabricated recessed structures in the first chip aligned with the one or more fiber coupling structures in the front surface of the second chip, such that a first fiber coupling structure is direct physical contact with a first conductor bump within a first V-groove.

2. The optical transceiver of claim 1 wherein the first chip comprises multiple electronics dies packaged together using an Embedding Insulation Sheet (EBIS) type material for the dielectric molding layer under a fan-out wafer level package (FOWLP) architecture overlying a HD-8940 Polybenzoxazole (PBO) film for the dielectric redistribution layer.

3. The optical transceiver of claim 1 wherein the multiple electronics devices comprise a PAM4 application-specific integrated circuit (ASIC) module, a driver module, a transimpedance amplifier module, and multiple alternating current (AC) coupling capacitors.

4. The optical transceiver of claim 1 wherein each of the plurality of conductor balls is bonded to a first conductive pad embedded in the dielectric redistribution layer.

5. The optical transceiver of claim 4 wherein the soldering material filled in each of the multiple TMVs is bonded to a second conductive pad embedded in the dielectric redistribution layer.

6. The optical transceiver of claim 1 wherein the second chip is a Si-photonics chip.

7. The optical transceiver of claim 6 wherein the Si-photonics chip comprises Si-based optical waveguides aligned to the one or more fiber coupling structures, a modulator, and multiple photo diodes.

8. The optical transceiver of claim 7 wherein the dielectric redistribution layer further comprises embedded conductive wires for selectively connecting the multiple electronics devices to at least the modulator and the multiple photo diodes respectively through the soldering material filled in the multiple TMVs and the multiple conductor bumps on the front surface of the second chip.

9. The optical transceiver of claim 8 further comprising one or more optical fibers being installed in the one or more fiber coupling structures between the front surface of the second chip and the dielectric molding layer of the first chip to couple with corresponding Si-based optical waveguides.

10. The optical transceiver of claim 6 wherein the second chip further comprises one or more laser diodes mounted on a recessed region of the front surface and electrically coupled via a mounting pad with at one or more of multiple conductor bumps through one or more conductive pads in the dielectric redistribution layer and one or more of the plurality of conductor balls to connect to the PCB without any external wire bonds.

* * * * *